US012131786B2

(12) United States Patent
Schneider et al.

(10) Patent No.: US 12,131,786 B2
(45) Date of Patent: Oct. 29, 2024

(54) MEMORY CELL ARRAY WITH ROW DIRECTION GAP BETWEEN ERASE GATE LINES AND DUMMY FLOATING GATES

(71) Applicant: Silicon Storage Technology, Inc., San Jose, CA (US)

(72) Inventors: Louisa Schneider, San Jose, CA (US); Xian Liu, Sunnyvale, CA (US); Steven Lemke, Boulder Creek, CA (US); Parviz Ghazavi, San Jose, CA (US); Jinho Kim, Saratoga, CA (US); Henry A. Om'Mani, Santa Clara, CA (US); Hieu Van Tran, San Jose, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 166 days.

(21) Appl. No.: 18/104,228

(22) Filed: Jan. 31, 2023

(65) Prior Publication Data
US 2024/0257880 A1 Aug. 1, 2024

(51) Int. Cl.
*G11C 5/06* (2006.01)
*G11C 16/16* (2006.01)
*H01L 23/48* (2006.01)
*H01L 29/423* (2006.01)
*H10B 41/10* (2023.01)
*H10B 41/27* (2023.01)

(52) U.S. Cl.
CPC ............ *G11C 16/16* (2013.01); *H01L 23/481* (2013.01); *H01L 29/42328* (2013.01); *H10B 41/10* (2023.02); *H10B 41/27* (2023.02)

(58) Field of Classification Search
CPC ....... G11C 5/063; G11C 7/18; G11C 11/4097; G11C 5/025; G11C 5/04
USPC ...................................... 365/63, 51, 185.05
See application file for complete search history.

(56) References Cited

U.S. PATENT DOCUMENTS

| 7,868,375 | B2 | 1/2011 | Liu et al. | |
| 2017/0110466 | A1* | 4/2017 | Chuang | H10B 41/50 |
| 2020/0381443 | A1* | 12/2020 | Shih | H01L 29/0847 |
| 2021/0066323 | A1 | 3/2021 | Huang et al. | |

OTHER PUBLICATIONS

PCT Search Report and Written Opinion mailed on Oct. 16, 2023 corresponding to the related PCT Patent Application No. US2023/012638.

* cited by examiner

*Primary Examiner* — Son T Dinh
(74) *Attorney, Agent, or Firm* — DLA Piper LLP (US)

(57) ABSTRACT

A memory cell array having rows and columns of memory cells with respective ones of the memory cells including spaced apart source and drain regions formed in a semiconductor substrate with a channel region extending there between, a floating gate over a first portion of the channel region, a select gate over a second portion of the channel region, and an erase gate over the source region. A strap region is disposed between first and second pluralities of the columns. For one memory cell row, a dummy floating gate is disposed in the strap region, an erase gate line electrically connects together the erase gates of the memory cells in the one row and in the first plurality of columns, wherein the erase gate line is aligned with the dummy floating gate with a row direction gap between the erase gate line and the dummy floating gate.

16 Claims, 8 Drawing Sheets

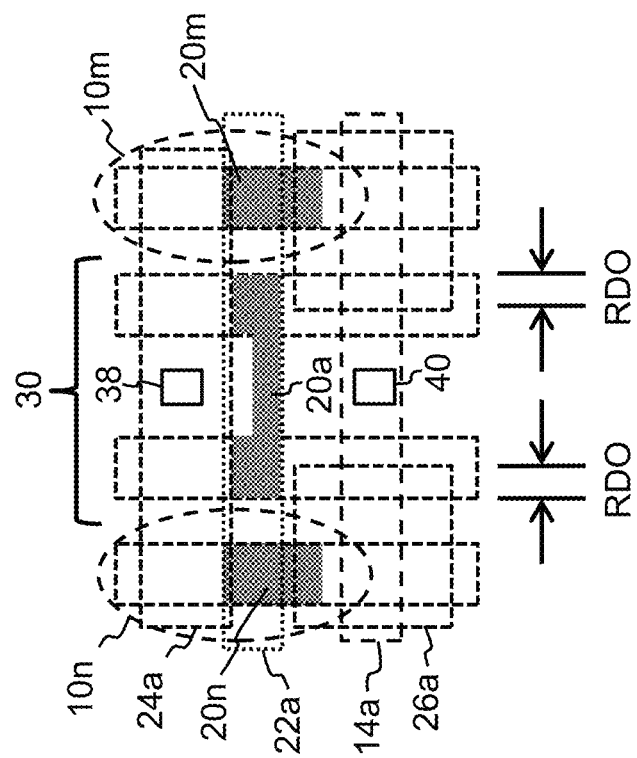

MEMORY CELL ARRAY WITH ROW DIRECTION GAP BETWEEN ERASE GATE LINES AND DUMMY FLOATING GATES

FIELD OF THE INVENTION

The present invention relates to non-volatile memory devices, and more particularly to improving the stability of the memory cell current during read operations.

BACKGROUND OF THE INVENTION

Non-volatile memory devices are well known in the art. See for example U.S. Pat. No. 7,868,375, which discloses a four-gate memory cell configuration. Specifically, FIG. 1 of the present application illustrates a split gate memory cell 10 with spaced apart source and drain regions 14/16 formed in a silicon semiconductor substrate 12. A channel region 18 of the semiconductor substrate is defined between the source/drain regions 14/16. A floating gate 20 is disposed over and insulated from (and controls the conductivity of) a first portion of the channel region 18 (and partially over and insulated from the source region 14). A control gate 22 is disposed over and insulated from the floating gate 20. A select gate 24 is disposed over and insulated from (and controls the conductivity of) a second portion of the channel region 18. The select gate 24 is laterally adjacent to the floating gate 20, and can include an upper portion that extends up and over the control gate 22. An erase gate 26 is disposed over and insulated from the source region 14 and is laterally adjacent to the floating gate 20, with an upper portion that extends up and over the floating gate 20 forming a notch 27 that faces an edge of the floating gate 20. The notch 27 and the edge of the floating gate can be insulated from each other by a tunnel oxide layer 28. Memory cells 10 can be arranged in pairs as shown in FIG. 1, where two memory cells 10 share a common source region 14.

Various combinations of voltages are applied to the control gate 22, select gate 24, erase gate 26 and/or source and drain regions 14/16, to program the memory cell 10 (i.e., injecting electrons onto the floating gate 20), to erase the memory cell 10 (i.e., removing electrons from the floating gate 20 through the tunnel oxide 28), and to read the memory cell (i.e., measuring or detecting the conductivity of the channel region 18 to determine the programming state of the floating gate 20).

Memory cell 10 can be operated in a digital manner, where the memory cell 10 is set to one of only two possible states: a programmed state and an erased state. The memory cell 10 is erased by placing a high positive voltage on the erase gate 26, and optionally a negative voltage on the control gate 22, to induce tunneling of electrons from the floating gate 20 to the erase gate 26 through the tunnel oxide layer 28 (leaving the floating gate 20 in a more positively charged stated—the erased state). Memory cell 10 can be programmed by placing positive voltages on the control gate 22, erase gate 26, select gate 24 and source region 14, and a current on drain region 16. Electrons will then flow along the channel region 18 from the drain region 16 toward the source region 14, with some electrons becoming accelerated and heated whereby they are injected onto the floating gate 20 by hot-electron injection (leaving the floating gate in a more negatively charged state—the programmed state). Memory cell 10 can be read by placing positive voltages on the select gate 24 (turning on the channel region portion under the select gate 24) and drain region 16 (and optionally on the erase gate 26 and/or the control gate 22), and sensing current flow through the channel region 18. If the floating gate 20 is positively charged (erased), the memory cell 10 will be turned on, and electrical current will flow from source region 14 to drain region 16 (i.e. the memory cell 10 is sensed to be in its erased "1" state based on sensed current flow). If the floating gate 20 is negatively charged (programmed), the channel region 18 under the floating gate 20 is turned off, thereby preventing any current flow (i.e., the memory cell 10 is sensed to be in its programmed "0" state based on no current flow).

The following table provides non-limiting examples of erase, program and read voltages:

TABLE 1

|         | WL (SG) | BL (Drain) | Source | EG     | CG     |
|---------|---------|------------|--------|--------|--------|
| Erase   | 0 V     | 0 V        | 0 V    | 11.5 V | 0 V    |
| Program | 1 V     | 1 μA       | 4.5 V  | 4.5 V  | 10.5 V |
| Read    | Vcc     | 0.6 V      | 0 V    | 0 V    | Vcc    |

Memory cell 10 can alternately be operated in an analog manner where the memory state (i.e. the amount of charge, such as the number of electrons, on the floating gate 20) of the memory cell can be continuously changed anywhere from a fully erased state (fewest electrons on the floating gate) to a fully programmed state (highest number of electrons on the floating gate), or just a portion of this range. This means the cell storage is analog, which allows for very precise and individual tuning of each memory cell 10 in a memory cell array. Alternatively, the memory could be operated as a MLC (multilevel cell) where it is configured to be programmed to one of many discrete values (such as 16 or 64 different values). In the case of analog or MLC programming, the programming voltages are applied for only a limited time, or as a series of pulses, until the desired programming state is achieved. In the case of multiple programming pulses, intervening read operations between programming pulses can be used to determine if the desired programming state has been achieved (in which case programming ceases) or has not been achieved (in which case programming continues).

Memory cells 10 can be arranged in an array (i.e., arranged in rows and columns). As shown in FIG. 1, each pair of memory cells 10 shares a common source region 14 and a common erase gate 26. As shown in the array layout in FIG. 2, the pairs of the memory cells shown in FIG. 1 can be arranged end to end in columns, where two adjacent pairs of the memory cells can share a common drain region 16. The source regions 14 for a row of memory cell pairs can be formed as a continuous source line 14a of diffusion in the semiconductor substrate 12, electrically connecting together all the source regions 14 for the row of memory cell pairs. The control gates 22 for a row of the memory cells 10 can be formed as a continuous control gate line 22a of conductive material, such as polysilicon, electrically connecting together all the control gates 22 for the row of memory cells. The select gates 24 for a row of the memory cells 10 can be formed as a continuous select gate line 24a (also can be referred to as a word line) of conductive material, such as polysilicon, electrically connecting together all the select gates 24 for the row of memory cells. The erase gates 26 for a row of the memory cells 10 can be formed as a continuous erase gate line 26a of conductive material, such as polysilicon, electrically connecting together all the erase gates 26 for the row of memory cells. The floating gates 20 can be formed of conductive material such as polysilicon.

There is a need to periodically connect to the various lines of the array.

BRIEF SUMMARY OF THE INVENTION

The aforementioned problems and needs are addressed by a memory cell array that includes a plurality of memory cells arranged in rows and columns, wherein respective ones of the memory cells includes spaced apart source and drain regions formed in a semiconductor substrate with a channel region extending there between, a floating gate disposed over and insulated from a first portion of the channel region, a select gate disposed over and insulated from a second portion of the channel region, and an erase gate disposed over and insulated from the source region. A strap region is disposed between a first plurality of columns of the memory cells and a second plurality of columns of the memory cells. For one of the rows of the memory cells, a dummy floating gate disposed in the strap region, over and insulated from the substrate, and between two of the memory cells in the one row of the memory cells, and a first erase gate line electrically connecting together the erase gates of the memory cells in the one row of the memory cells and in the first plurality of columns of the memory cells, wherein the first erase gate line is aligned with the dummy floating gate with a first row direction gap between the first erase gate line and the dummy floating gate.

A memory cell array includes a plurality of memory cells arranged in rows and columns, wherein respective ones of the memory cells includes spaced apart source and drain regions formed in a semiconductor substrate with a channel region extending there between, a floating gate disposed over and insulated from a first portion of the channel region, a select gate disposed over and insulated from a second portion of the channel region, and an erase gate disposed over and insulated from the source region. A strap region is disposed between a first plurality of columns of the memory cells and a second plurality of columns of the memory cells. For a first row of the memory cells and a second row of the memory cells, a first dummy floating gate disposed in the strap region, over and insulated from the substrate, and between two of the memory cells in the first row of the memory cells, a second dummy floating gate disposed in the strap region, over and insulated from the substrate, and between two of the memory cells in the second row of the memory cells, a first erase gate line electrically connecting together the erase gates of the memory cells in the first and second rows of the memory cells and in the first plurality of columns of the memory cells, and the first erase gate line is aligned with the first dummy floating gate with a first row direction gap between the first erase gate line and the first dummy floating gate, and is aligned with the second dummy floating gate with a second row direction gap between the first erase gate line and the second dummy floating gate.

Other objects and features of the present disclosure will become apparent by a review of the specification, claims and appended figures.

BRIEF DESCRIPTION OF THE DRAWINGS

FIG. 4 is a partial layout diagram illustrating a layout of the various lines and one of the strap regions of an array of memory cells.

DETAILED DESCRIPTION OF THE INVENTION

Figure 3:
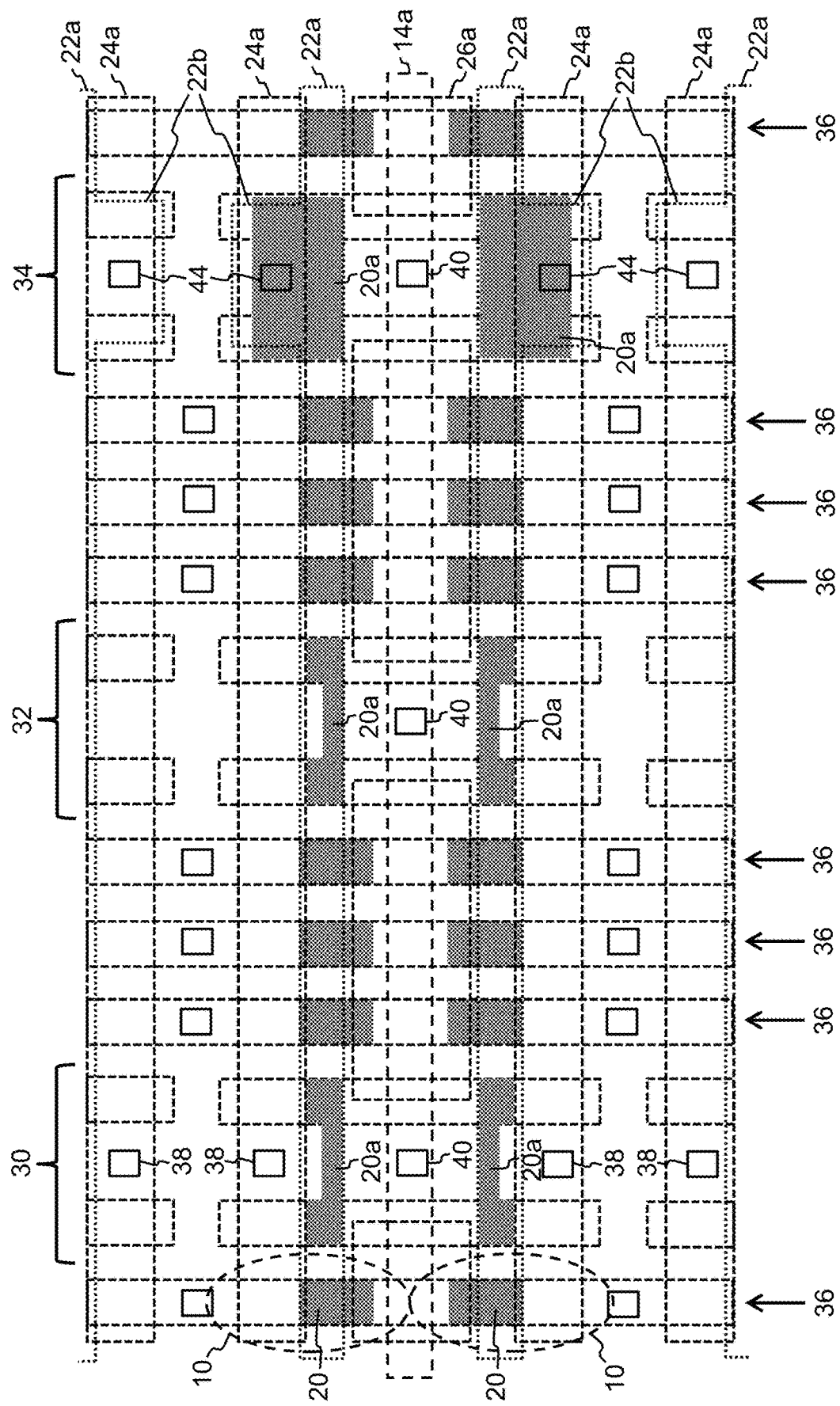
FIG. 3 is a layout diagram illustrating a layout of the various lines and strap regions of an array of memory cells.

Periodic strap regions can be incorporated in a memory cell array to provide space and access to connect to the various lines of a memory array. FIG. 3 illustrates a memory array of memory cells 10 similar to that of FIG. 1, with the same element numbers directed to like elements. The memory array of FIG. 3 includes a first strap region 30, a second strap region 32 and a third strap region 34. Each strap region is an area between two of the columns 36 of memory cells 10. In the example of FIG. 3, three columns 36 of memory cells are shown disposed between respective strap regions, however the number of columns 36 of memory cells 10 between respective strap regions can vary.

The strap regions 30, 32, 34 provide areas between the columns of memory cells 36 in which vertical contacts can be formed extending down from higher level metal layers (in which signal lines can be formed) that make electrical contact with the various lines of the memory array. For example, in first strap region 30, vertical contacts 38 extend down from a metal layer above and make electrical contact with select gate lines (word lines) 24*a*, and vertical contacts 40 extend down from a metal layer above and make electrical contact with source lines 14*a*. In the example of FIG. 3, each source line 14*a* electrically connects together the source regions 14 of two rows of the memory cells (and extends across the strap regions 30, 32, 34). Each erase gate line 26*a* electrically connects together the erase gates of the memory cells in two adjacent rows of the memory cells. In order to provide access to the source lines 14*a*, the portions of the erase gate lines 26*a* at the center of the first strap region are removed (e.g., by an etch) so that the vertical contacts 40 can make electrical contact with the source lines 14*a* without making electrical contact with the erase gate lines 26*a* (i.e., the vertical contact is electrically connected to the source line and is disposed in the first strap region 30 and between the erase gate lines 26*a*). In second strap region 32, vertical contacts 40 extend down from a metal layer above and make electrical contact with source lines 14*a*. In order to provide access to the source lines 14*a*, the portions of the erase gate lines 26*a* at the center of the second strap region 32 are removed (e.g., by an etch) so that the vertical contacts 40 can make electrical contact with the source lines 14*a* without making electrical contact with the erase gate lines 26*a* (i.e., the vertical contact is electrically connected to the source line and is disposed in the first strap region 30 and between the erase gate lines 26a). In third strap region 34, vertical contacts 44 extend down from a metal layer above and make electrical contact with tab portions 22b (i.e., widened portions) of control gate lines 22a, and vertical contacts 40 extend down from a metal layer above and make electrical contact with source lines 14a. In order to provide access to the source lines 14a, the portions of the erase gate lines 26a at the center of the third strap region 34 are removed (e.g., by an etch) so that the vertical contacts 40 can make electrical contact with the source lines 14a without making electrical contact with the erase gate lines 26a (i.e., the vertical contact is electrically connected to the source line and is disposed in the first strap region 30 and between the erase gate lines 26a). Because diffusion in the semiconductor substrate 12 (that forms the source lines 14a) is less conductive than the metal lines to which they are connected, vertical contacts 40 for the source lines 14a may be included in all three strap regions 30, 32, 34.

To facilitate manufacturing, and maintain polysilicon density in the strap regions 30, 32, 34 relative to the columns of memory cells, dummy floating gates 20a can be formed in the strap regions 30, 32, 34 as shown in FIG. 3. The dummy floating gates 20a can be formed in portions of the strap regions 30, 32, 34 where the control gate line 22a overlaps with underlying diffusion in the semiconductor substrate 12, and may be of the same conductive material as the floating gates 20 (such as polysilicon), and the same general configuration as the floating gates 20 (i.e., disposed over and insulated from the substrate). For any given strap region and row of memory cells, there can be a dummy floating gate 20a disposed in the strap region and between two of the memory cells 10 in that row of memory cells. Forming dummy floating gates 20a as part of the process of forming floating gates 20 streamlines manufacturing, and increases reliability and yield by making the density of conductive material in the strap regions 30, 32, 34 closer to that of the memory cell columns.

Figure 5:
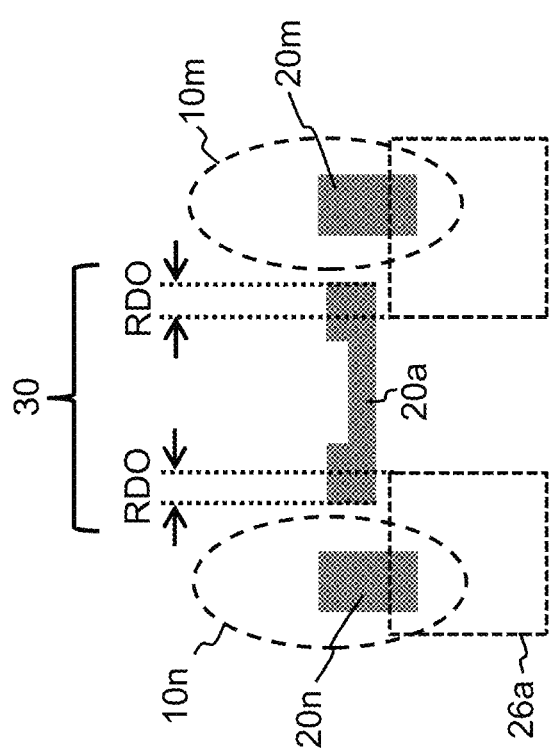
FIG. 5 is a partial layout diagram illustrating a row direction overlap between one of the erase gate lines and one of the dummy floating gates.

It has been discovered by the present inventors that the proximity of the erase gate lines 26a to the dummy floating gates 20a can cause capacitive coupling therebetween that can in turn disturb the programming state of adjacent memory cells. For example, as shown in FIG. 4, memory cell 10n with floating gate 20n is adjacent strap region 30 with dummy floating gate 20a, which in turn is adjacent memory cell 10m with floating gate 20m. Erase gate lines 26a extend partially into strap region 30, such that erase gate lines 26a partially overlap with dummy gate 20a in the row direction (referred to herein as row direction overlap, RDO) on both ends of the dummy floating gate 20a, as shown in FIGS. 4-5. As used herein, row direction overlap RDO relates to how each erase gate line 26a is aligned with respective dummy floating gates 20a, and is the distance between two vertical lines (extending in the column direction) one of which being aligned with the edge of the dummy floating gate 20a and the other of which being aligned with the edge of the adjacent erase gate line 26a, indicating the overlap of these two features in the row direction (even though these elements are separated from each other in the column direction so there is no actual, physical overlap). The row direction overlap RDO results in excessive capacitive coupling between the dummy floating gate 20a and the erase gate line 26a, such that erasing or programming memory cell 10n can disturb the programming state of memory cell 10m. For example, erasing the floating gate 20n of memory cell 10n can at least partially erase dummy floating gate 20a, which in turn can at least partially erase floating gate 20m of memory cell 10m and or cause data retention leakage for both floating gates 20n and 20m. Additionally, programming floating gate 20n can partially program dummy floating gate 20a, which in turn can cause the partially programmed dummy floating gate 20a to disturb the program state of floating gate 20m of memory cell 10m.

Figure 6:
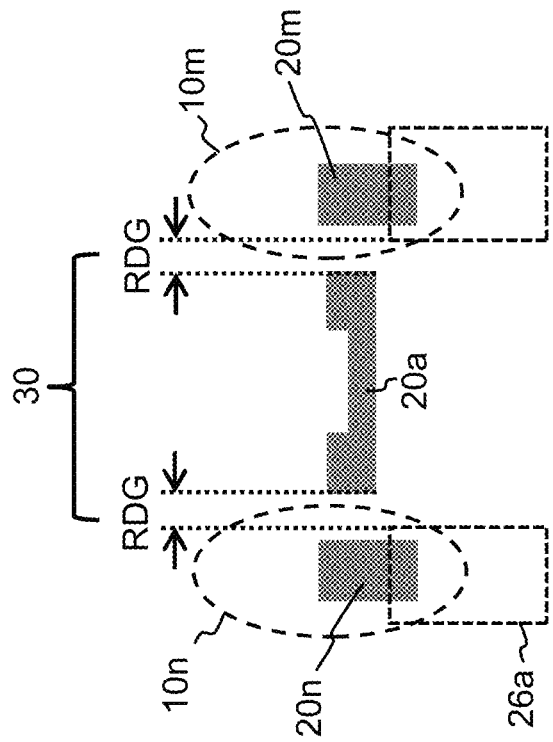
FIG. 6 is a partial layout diagram illustrating a row direction gap between one of the erase gate lines and one of the dummy floating gates.
Figure 7:
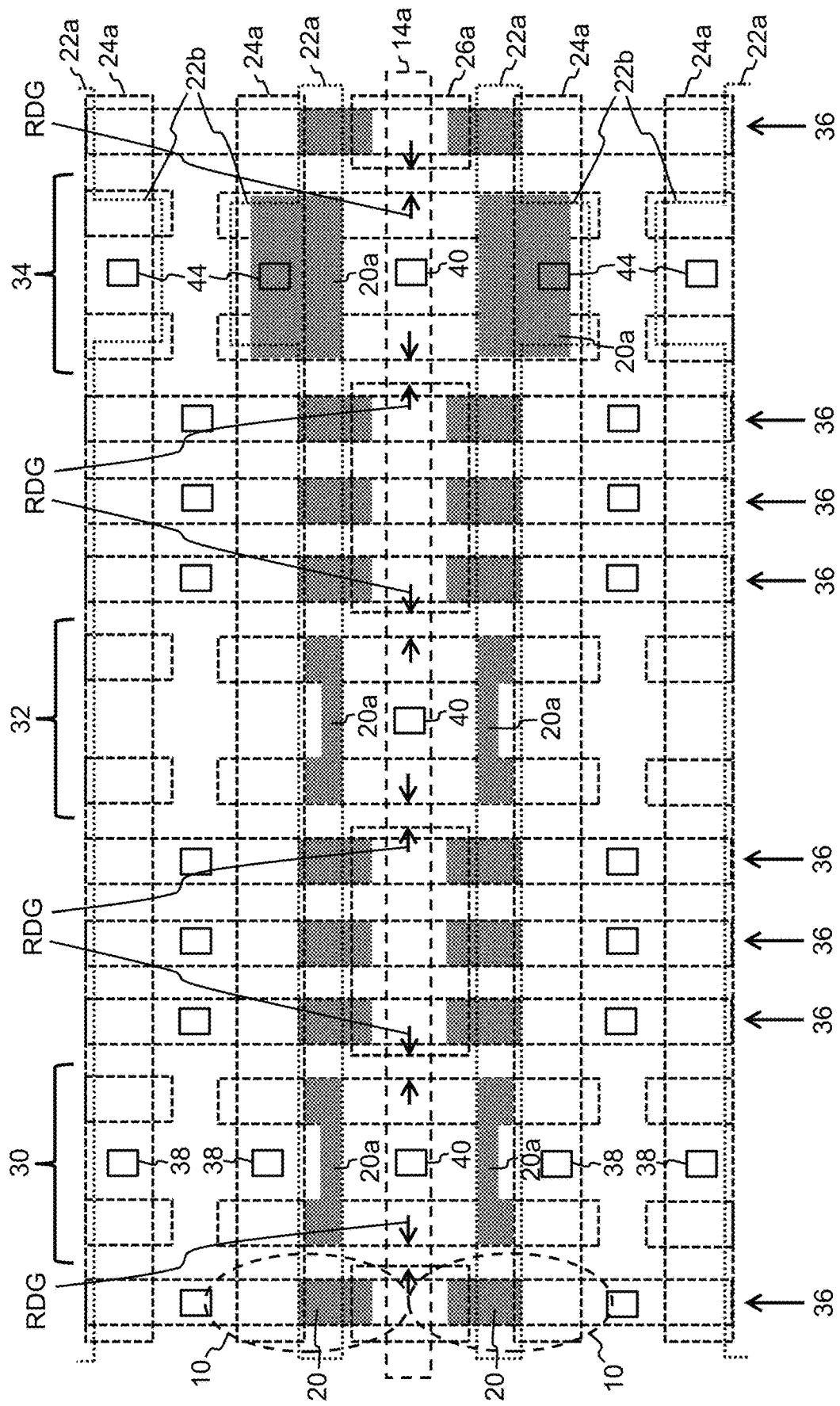
FIG. 7 is a layout diagram illustrating a layout of the various lines and strap regions of an array of memory cells, with row direction gaps between the erase gate lines and the dummy memory cells.

The present inventors have determined that reconfiguring the alignment of erase gate lines 26a in the vicinity of the respective dummy floating gates 20a strap regions, to replace the row direction overlap RDO between the dummy floating gate 20a and the erase gate line 26a, with a row direction gap RDG between the dummy floating gate 20a and the respective erase gate line 26a, can result in significant reductions of unintended changes of the program state of the dummy floating gates 22a, and therefore significant reductions of program state disturbances for the nearby memory cell floating gates 20. As used herein, row direction gap RDG relates to how each erase gate line 26a is aligned with respective dummy floating gates 20a, and is the distance between two vertical lines (extending in the column direction) one of which being aligned with the edge of the dummy floating gate 20a and the other of which being aligned with the edge of the respective adjacent erase gate line 26a, indicating the gap between these two features in the row direction, as shown in FIGS. 6 and 7. For any given dummy floating gate 20a in one of the rows of memory cells 10, there is a first row direction gap RDG relative to a first erase gate line 26a (e.g. to the left or right side of the dummy erase gate 20a), and a second row direction gap RDG relative to a second erase gate line 26a (e.g., to the other of the left or right side of the dummy erase gate 20a), as shown in FIGS. 6 and 7. The first and second row direction gaps on either side of the dummy floating gate 20a can be, but need not be, the same size. Where the edges are not linear, the vertical lines would intersect the furthest point at which the respective dummy floating gate 20a extends in the row direction toward the respective adjacent memory cell column, and the respective erase gate line 26a extends in the row direction towards the center of the strap region. Having the erase gate lines 26a aligned with the dummy floating gates 20a with row gaps RDG means this alignment has no row direction overlap RDO (i.e., row direction gap RDG and row direction overlap RDO are mutually exclusive).

It has been further determined that a minimum value of the row direction gap RDG to achieve improved performance can be associated with the thickness of the tunnel oxide layer 28, because it has been discovered that the larger the tunnel oxide, the greater the row direction gap should be. Specifically, the thickness of the tunnel oxide layer 28 can be selected in view of the erase operation voltage placed in the erased gate, and therefore is indicative of the potential capacitive coupling between the erase gate line 26a and dummy floating gates 20a. The electric field, $\vec{E}$, in the vicinity of the tunnel oxide can be expressed as:

$$\vec{E} = \frac{V}{t_{ox}}$$

where V is the voltage across the tunnel oxide and $t_{ox}$ is the tunnel oxide thickness. Fowler Nordheim tunneling current density, J, can be expressed as:

$$J = A \cdot E^2 \cdot e^{-\frac{B}{E}} = A \cdot \left(\frac{V}{t_{ox}}\right)^2 \cdot e^{-\frac{B \cdot t_{ox}}{V}}$$

where A,B are constants, and V is the erase voltage placed on the erase gate line during the erase operation. To reduce the Fowler-Nordheim current density between the dummy floating gate 20a and the erase gate line 26a to a low or insignificant amount, and the row direction gap RDG can be sufficient to reduce the likelihood of tunneling between the dummy floating gate 20a and the erase gate line 26a. It has been determined that providing a row direction gap RDG of at least twice the thickness of the tunnel oxide layer 28 ensures that any Fowler-Nordheim current density between the dummy floating gate 20a and the erase gate line 26a is a low or insignificant amount. Having a row direction gap RDG be at least twice the thickness of the tunnel oxide layer 28 also ensures that the desired and effective row direction gap RDG is maintained as devices scale down in size.

Figure 1:
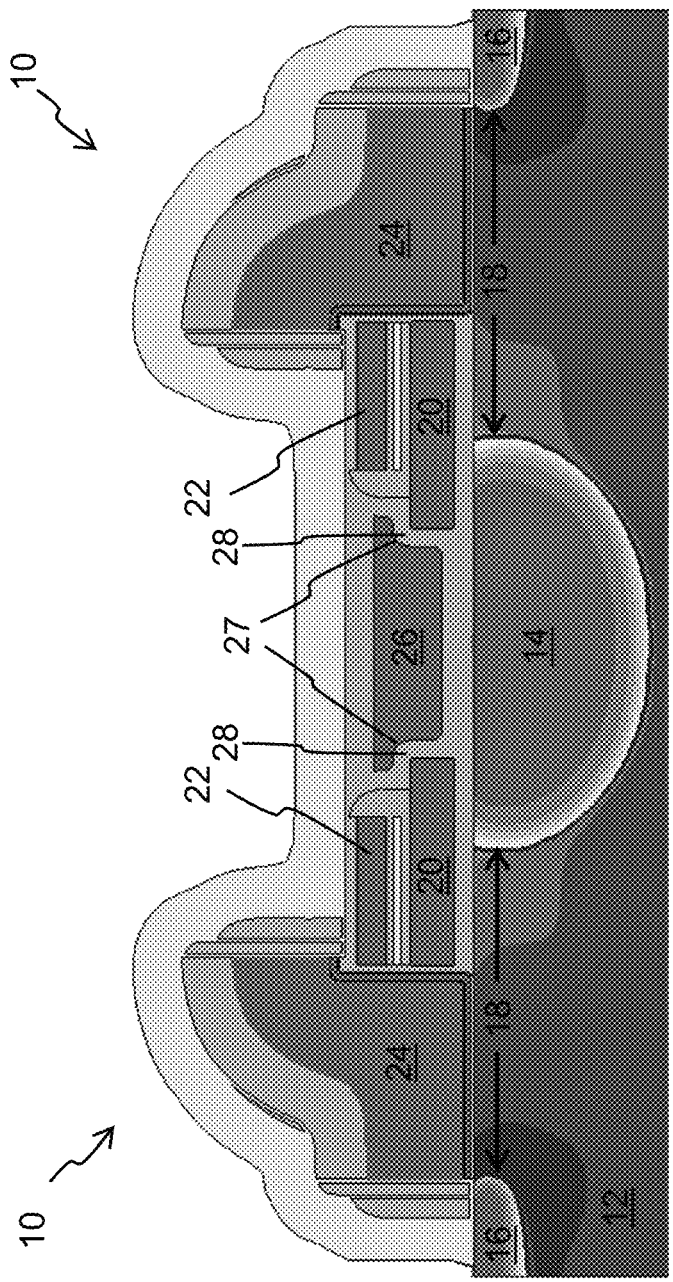
FIG. 1 is a side cross sectional view of a pair of conventional memory cells.
Figure 2:
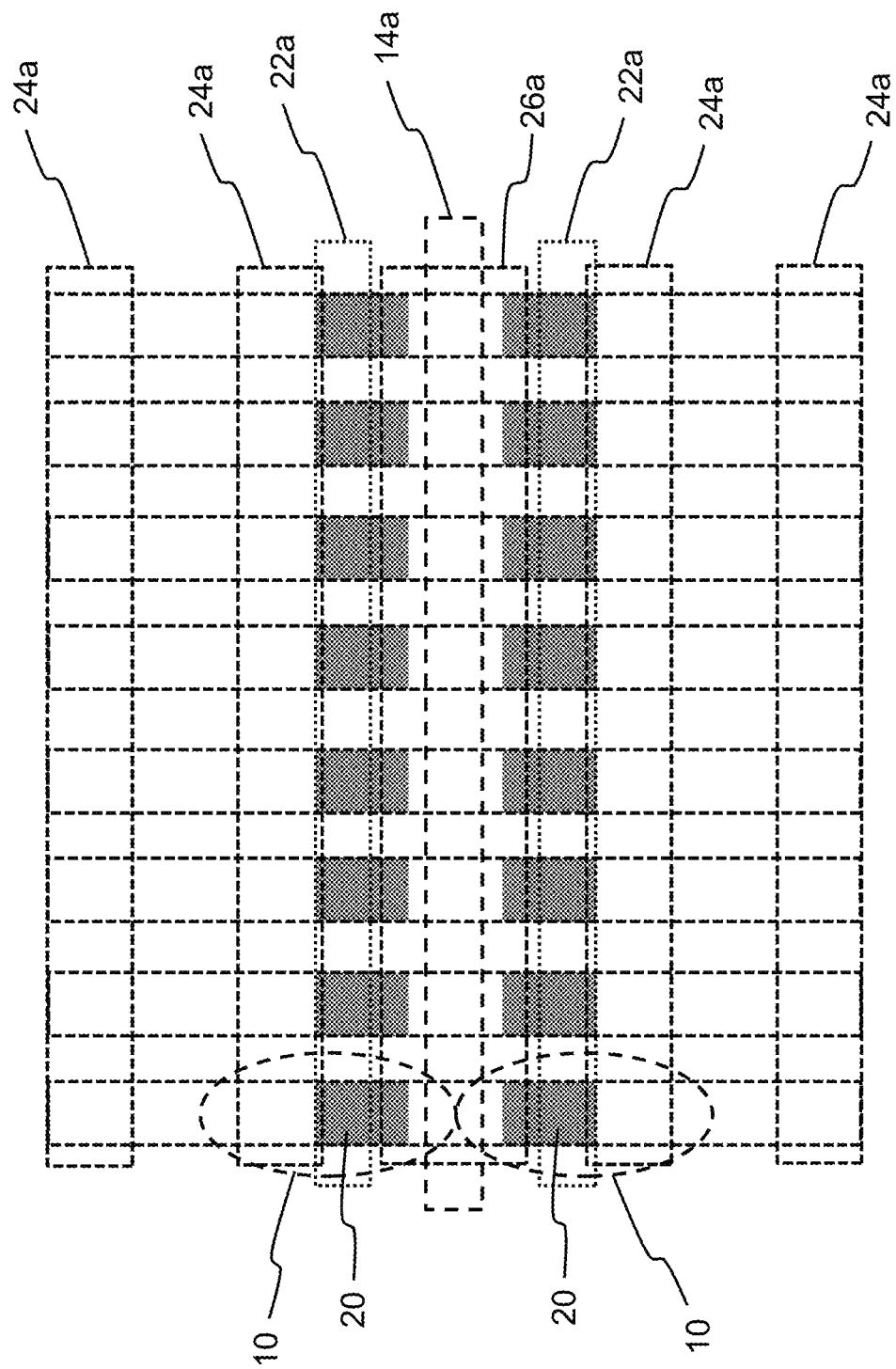
FIG. 2 is a layout diagram illustrating a conventional layout of the various lines of an array of memory cells.
Figure 8:
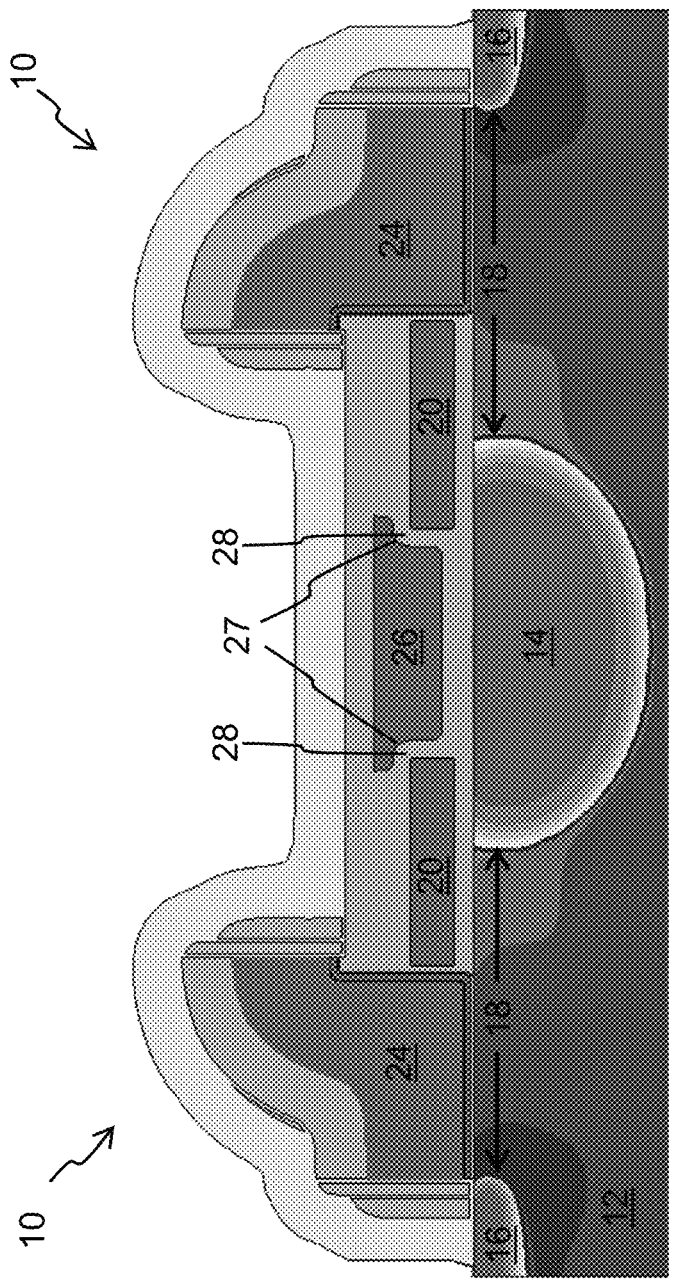
FIG. 8 is a side cross sectional view of an alternate example of a memory cell.
Figure 9:
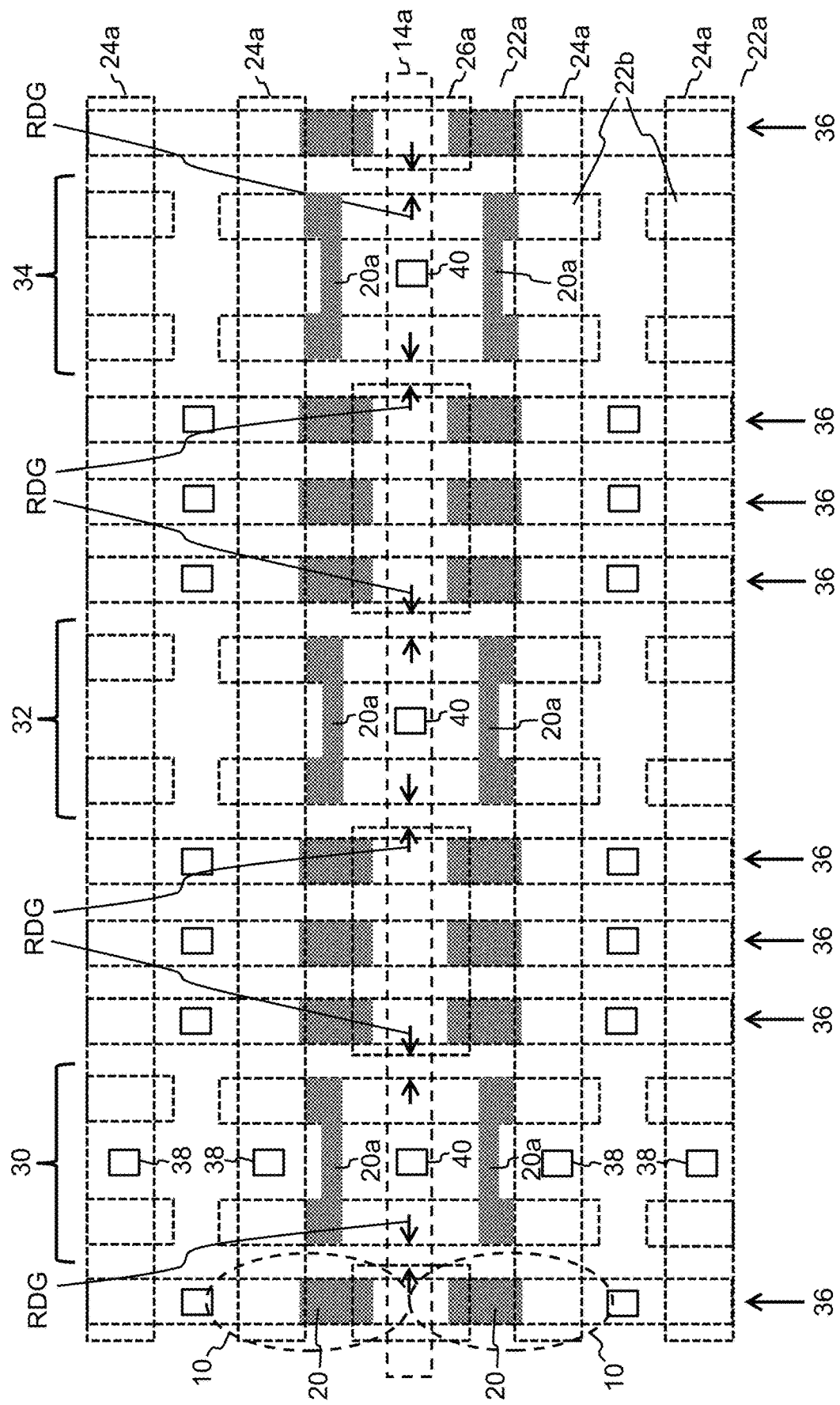
FIG. 9 is a layout diagram illustrating a layout of the various lines and strap regions of an array of the memory cells of FIG. 8, with row direction gaps between the erase gate lines and the dummy memory cells.

Having a row direction gap RDG of at least twice the thickness of the tunnel oxide layer 28 can be implemented in non-volatile memory cell configurations deviating from that of FIG. 1. Specifically, FIG. 8 illustrates a memory cell similar to that of FIG. 1, but with the control gate omitted. FIG. 9 illustrates an array of the memory cells of FIG. 8, with the row direction gap RDG between the erase gate lines 26a and dummy memory cells 20a.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps may need to be performed in the exact order illustrated or claimed unless specified.

What is claimed is:

1. A memory cell array, comprising:
   a plurality of memory cells arranged in rows and columns, wherein respective ones of the memory cells includes spaced apart source and drain regions formed in a semiconductor substrate with a channel region extending there between, a floating gate disposed over and insulated from a first portion of the channel region, a select gate disposed over and insulated from a second portion of the channel region, and an erase gate disposed over and insulated from the source region;
   a strap region disposed between a first plurality of columns of the memory cells and a second plurality of columns of the memory cells; and
   for one of the rows of the memory cells:
      a dummy floating gate disposed in the strap region, over and insulated from the substrate, and between two of the memory cells in the one row of the memory cells, and
      a first erase gate line electrically connecting together the erase gates of the memory cells in the one row of the memory cells and in the first plurality of columns of the memory cells, wherein the first erase gate line is aligned with the dummy floating gate with a first row direction gap between the first erase gate line and the dummy floating gate.

2. The memory cell array of claim 1, further comprising:
   a second erase gate line electrically connecting together the erase gates of the memory cells in the one row of the memory cells and in the second plurality of columns of the memory cells, wherein the second erase gate line is aligned the dummy floating gate with a second row direction gap between the second erase gate line and the dummy floating gate.

3. The memory cell array of claim 2, further comprising:
   a source line electrically connecting together the source regions of the memory cells in the one row of the memory cells and in the first and second pluralities of columns of the memory cells, wherein the source line extends across the strap region; and
   a vertical contact electrically connected to the source line and disposed in the strap region and between the first and second erase gate lines.

4. The memory cell array of claim 1, further comprising:
   a select gate line electrically connecting together the select gates of the memory cells in the one row of the memory cells and in the first and second pluralities of columns of the memory cells, wherein the select gate line extends across the strap region; and
   a vertical contact electrically connected to the select gate line and disposed in the strap region.

5. The memory cell array of claim 1, wherein the respective ones of the memory cells further comprises a control gate disposed over and insulated from the floating gate.

6. The memory cell array of claim 5, further comprising:
   a control gate line electrically connecting together the control gates of the memory cells in the one row of the memory cells and in the first and second pluralities of columns of the memory cells, wherein the control gate line extends across the strap region; and
   a vertical contact electrically connected to the control gate line and disposed in the strap region.

7. The memory cell array of claim 1, wherein:
   the erase gates of the memory cells in the one row of the memory cells and in the first plurality of columns of the memory cells are insulated from respective floating gates by a tunnel oxide layer having a thickness;
   wherein the first row direction gap is at least twice the thickness of the tunnel oxide layer.

8. The memory array cell of claim 2, wherein:
   the erase gates of the memory cells in the one row of the memory cells and in the second plurality of columns of the memory cells are insulated from respective floating gates by a tunnel oxide layer having a thickness;
   wherein the second row direction gap is at least twice the thickness of the tunnel oxide layer.

9. A memory cell array, comprising:
   a plurality of memory cells arranged in rows and columns, wherein respective ones of the memory cells includes spaced apart source and drain regions formed in a semiconductor substrate with a channel region extending there between, a floating gate disposed over and insulated from a first portion of the channel region, a select gate disposed over and insulated from a second portion of the channel region, and an erase gate disposed over and insulated from the source region;
   a strap region disposed between a first plurality of columns of the memory cells and a second plurality of columns of the memory cells; and
   for a first row of the memory cells and a second row of the memory cells:
      a first dummy floating gate disposed in the strap region, over and insulated from the substrate, and between two of the memory cells in the first row of the memory cells, a second dummy floating gate disposed in the strap region, over and insulated from the substrate, and between two of the memory cells in the second row of the memory cells, a first erase gate line electrically connecting together the erase gates of the memory cells in the first and second rows of the memory cells and in the first plurality of columns of the memory cells, and the first erase gate line is aligned with the first dummy floating gate with a first row direction gap between the first erase gate line and the first dummy floating gate, and is aligned with the second dummy floating gate with a second row direction gap between the first erase gate line and the second dummy floating gate.

10. The memory cell array of claim 9, further comprising:

a second erase gate line electrically connecting together the erase gates of the memory cells in the first and second rows of the memory cells and in the second plurality of columns of the memory cells, wherein the second erase gate line is aligned the first dummy floating gate with a third row direction gap between the second erase gate line and the first dummy floating gate, and is aligned with the second dummy floating gate with a fourth row direction gap between the second erase gate line and the second dummy floating gate.

11. The memory cell array of claim 10, further comprising:

a source line electrically connecting together the source regions of the memory cells in the first and second rows of the memory cells and in the first and second pluralities of columns of the memory cells, wherein the source line extends across the strap region; and a vertical contact electrically connected to the source line and disposed in the strap region and between the first and second erase gate lines.

12. The memory cell array of claim 9, further comprising:

a first select gate line electrically connecting together the select gates of the memory cells in the first row of the memory cells and in the first and second pluralities of columns of the memory cells, wherein the first select gate line extends across the strap region;

a first vertical contact electrically connected to the first select gate line and disposed in the strap region;

a second select gate line electrically connecting together the select gates of the memory cells in the second row of the memory cells and in the first and second pluralities of columns of the memory cells, wherein the second select gate line extends across the strap region; and a second vertical contact electrically connected to the second select gate line and disposed in the strap region.

13. The memory cell array of claim 9, wherein the respective ones of the memory cells further comprises a control gate disposed over and insulated from the floating gate.

14. The memory cell array of claim 13, further comprising:

a first control gate line electrically connecting together the control gates of the memory cells in the first row of the memory cells and in the first and second pluralities of columns of the memory cells, wherein the first control gate line extends across the strap region;

a first vertical contact electrically connected to the first control gate line and disposed in the strap region;

a second control gate line electrically connecting together the control gates of the memory cells in the second row of the memory cells and in the first and second pluralities of columns of the memory cells, wherein the second control gate line extends across the strap region; and a second vertical contact electrically connected to the second control gate line and disposed in the strap region.

15. The memory cell array of claim 9, wherein:

the erase gates of the memory cells in the first and second rows of the memory cells and in the first plurality of columns of the memory cells are insulated from respective floating gates by a tunnel oxide layer having a thickness;

wherein the first row direction gap is at least twice the thickness and the second row direction gap is at least twice the thickness of the tunnel oxide layer.

16. The memory array cell of claim 10, wherein:

the erase gates of the memory cells in the first and second rows of the memory cells and in the second plurality of columns of the memory cells are insulated from respective floating gates by a tunnel oxide layer having a thickness;

wherein the third row direction gap is at least twice the thickness of the tunnel oxide layer and the fourth row direction gap is at least twice the thickness of the tunnel oxide layer.

* * * * *